(12) United States Patent
Kitamura et al.

(10) Patent No.: US 12,322,700 B2
(45) Date of Patent: Jun. 3, 2025

(54) WIRING BASE AND ELECTRONIC DEVICE

(71) Applicant: KYOCERA Corporation, Kyoto (JP)

(72) Inventors: Toshihiko Kitamura, Kyoto (JP);
Takeo Satake, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 352 days.

(21) Appl. No.: 17/799,372

(22) PCT Filed: Jan. 14, 2021

(86) PCT No.: PCT/JP2021/000936
§ 371 (c)(1),
(2) Date: Aug. 12, 2022

(87) PCT Pub. No.: WO2021/166498
PCT Pub. Date: Aug. 26, 2021

(65) Prior Publication Data
US 2023/0057427 A1 Feb. 23, 2023

(30) Foreign Application Priority Data

Feb. 18, 2020 (JP) ................................. 2020-025378

(51) Int. Cl.
*H01L 23/528* (2006.01)
*H01L 23/04* (2006.01)
(Continued)

(52) U.S. Cl.
CPC ............ *H01L 23/528* (2013.01); *H01L 23/04* (2013.01); *H01L 23/08* (2013.01);
(Continued)

(58) Field of Classification Search
CPC ....... H01L 23/528; H01L 23/04; H01L 23/08; H01L 23/49866; H01L 23/49811;
(Continued)

(56) References Cited

FOREIGN PATENT DOCUMENTS

| JP | 05/047992 A | 2/1993 |
|----|-------------|--------|
| JP | 2009-260095 A | 11/2009 |

(Continued)

OTHER PUBLICATIONS

English translation of JP2011187915 (Year: 2011).*
(Continued)

*Primary Examiner* — Evan G Clinton
*Assistant Examiner* — Douglas Yap
(74) *Attorney, Agent, or Firm* — Volpe Koenig

(57) ABSTRACT

In an embodiment of the present disclosure, a wiring base includes an insulative base, a signal conductor, a first lead terminal, a first ground conductor, and a second lead terminal. The insulative base includes a first face and a second face. The signal conductor is provided on the first face. The first lead terminal is provided on the signal conductor. The first lead terminal extends in a first direction and includes a portion projecting from the insulative base in plan view toward the first face. The first ground conductor is provided on the second face. The second lead terminal is provided on the first ground conductor. At least a part of the second lead terminal overlaps the first lead terminal in the plan view toward the first face.

12 Claims, 14 Drawing Sheets

(51) Int. Cl.
*H01L 23/053* (2006.01)
*H01L 23/057* (2006.01)
*H01L 23/08* (2006.01)
*H01L 23/498* (2006.01)
*H01S 5/022* (2021.01)
*H05K 1/02* (2006.01)
*H05K 3/32* (2006.01)
*H05K 5/02* (2006.01)
*H05K 1/18* (2006.01)

(52) U.S. Cl.
CPC ........ H01L 23/49866 (2013.01); H01S 5/022 (2013.01); H05K 1/0216 (2013.01); H05K 1/025 (2013.01); H05K 5/0247 (2013.01); *H01L 23/053* (2013.01); *H01L 23/057* (2013.01); *H05K 1/18* (2013.01); *H05K 3/32* (2013.01); *H05K 2201/10765* (2013.01)

(58) Field of Classification Search
CPC ....... H01L 23/05; H01L 23/66; H01L 23/057; H01L 23/043; H01L 23/045; H01L 23/049; H01L 23/053; H01L 23/55; H01L 2223/6605; H01S 5/022; G02B 6/428; G02B 6/4279; H05K 5/0237–0253; H05K 5/0215; H05K 5/0216–0228
See application file for complete search history.

(56) References Cited

FOREIGN PATENT DOCUMENTS

| JP | 2011187915 A | * | 9/2011 | ................ H05K 3/34 |
|---|---|---|---|---|
| JP | 2012222079 A | * | 11/2012 | ............ H01L 23/02 |
| JP | 2013-074048 A | | 4/2013 | |
| WO | WO2015030093 A1 | * | 3/2015 | ............. H01L 23/04 |
| WO | WO-2015088028 A1 | * | 6/2015 | ........... H01L 23/057 |

OTHER PUBLICATIONS

English translation of WO2015088028 (Year: 2015).*
Shirasaki JP 2012222079 (Year: 2012).*
Kawazu093 WO 2015030093 (Year: 2015).*

* cited by examiner

FIG. 13
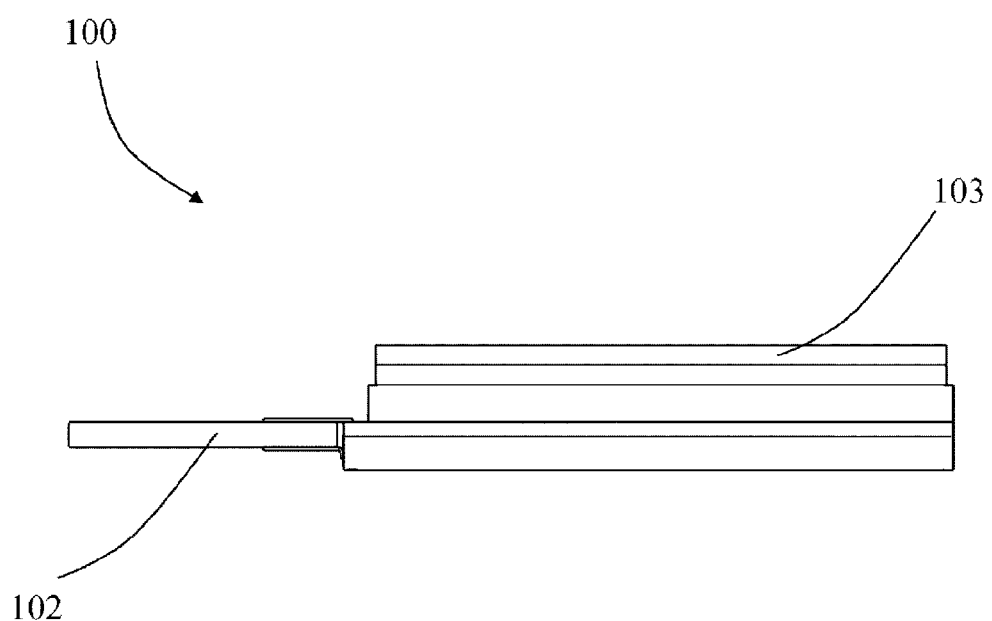
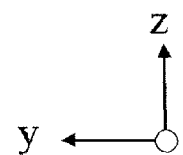

FIG. 14
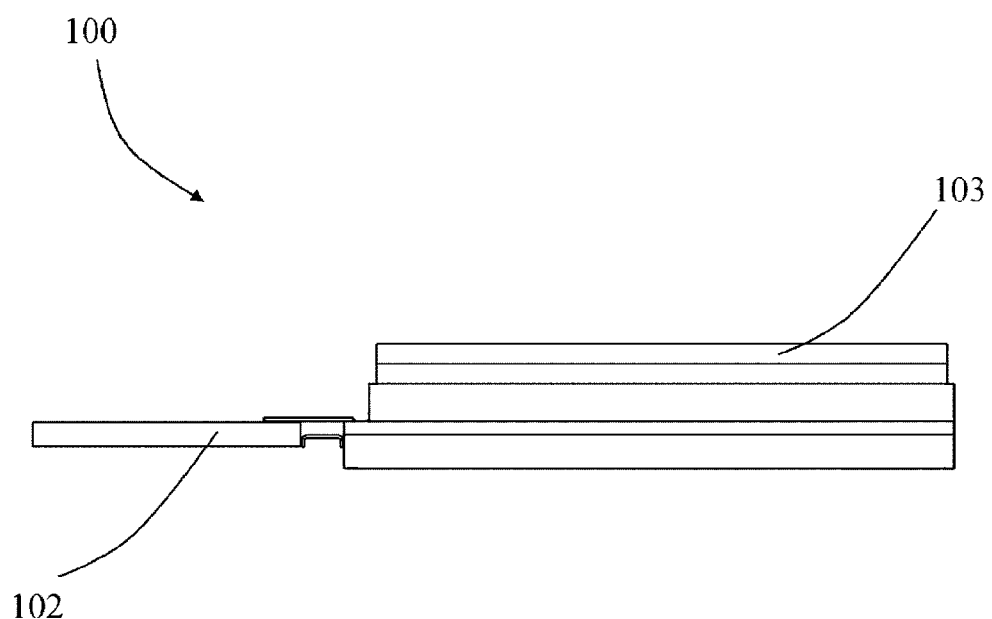
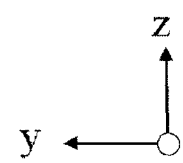

WIRING BASE AND ELECTRONIC DEVICE

TECHNICAL FIELD

The present disclosure relates to a wiring base and an electronic device.

BACKGROUND OF INVENTION

Known optical modules configured to transmit high-frequency signals of millimeter wavebands each include a ceramic substrate, a conductor pattern provided on the ceramic substrate, and a lead terminal provided on the conductor pattern. Japanese Unexamined Patent Application Publication No. 2009-260095 discloses an optical subassembly including an optical module and a flexible substrate connected to the optical module.

SUMMARY

In an embodiment of the present disclosure, a wiring base includes an insulative base, a signal conductor, a first lead terminal, a first ground conductor, and a second lead terminal. The insulative base includes a first face and a second face. The signal conductor is provided on the first face. The first lead terminal is provided on the signal conductor. The first lead terminal extends in a first direction and includes a portion projecting from the insulative base in plan view toward the first face. The first ground conductor is provided on the second face. The second lead terminal is provided on the first ground conductor. At least a part of the second lead terminal overlaps the first lead terminal in the plan view toward the first face.

In an embodiment of the present disclosure, an electronic device includes the wiring base configured as above, and an external substrate. The external substrate is connected to the first lead terminal and to the second lead terminal.

BRIEF DESCRIPTION OF THE DRAWINGS

FIG. 13 is a side plan view of an electronic device according to an embodiment of the present disclosure.

FIG. 14 is a side plan view of an electronic device according to an embodiment of the present disclosure.

DESCRIPTION OF EMBODIMENTS

Figure 1:
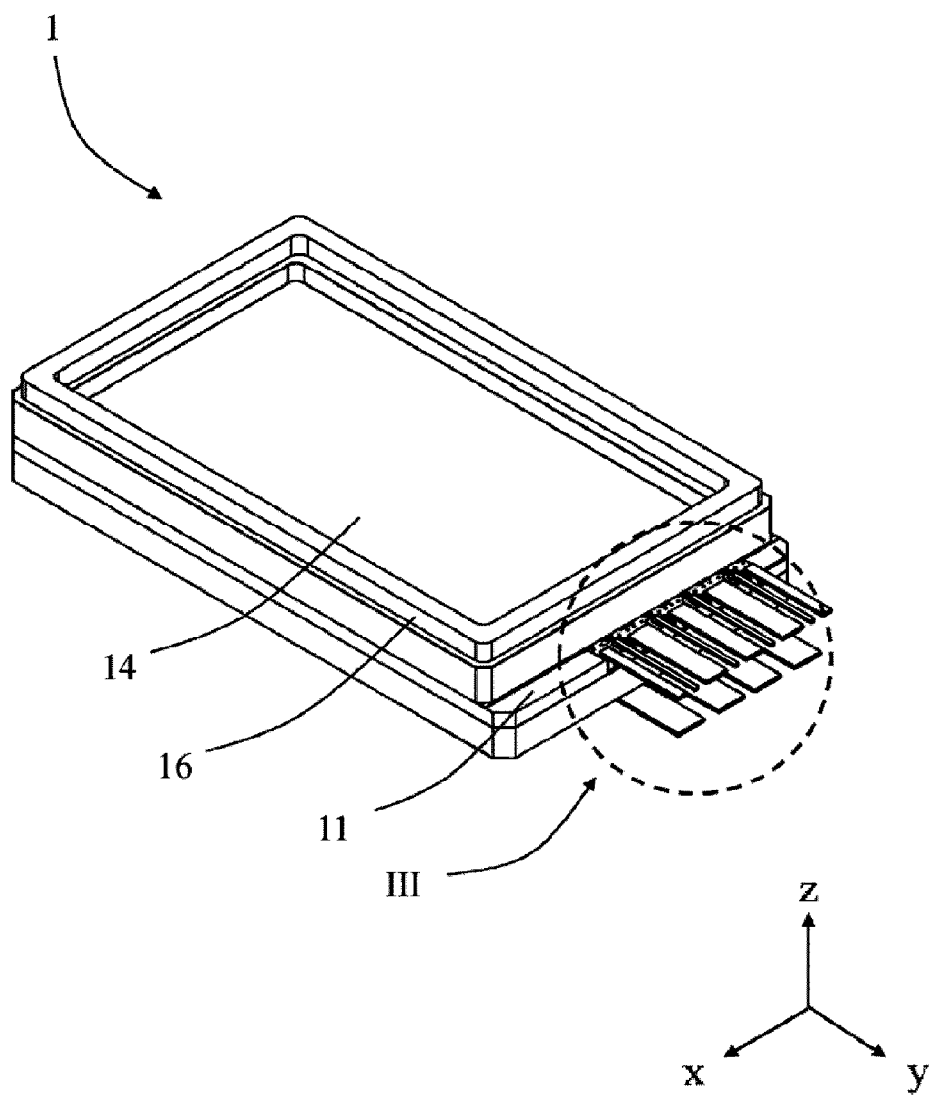
FIG. 1 is a top perspective view of a wiring base according to an embodiment of the present disclosure.

Wiring bases 1 and electronic devices 100 according to embodiments of the present disclosure will now be described with reference to the drawings. In the following description, a structure in which an electronic component 101 is mounted on a wiring base 1 is referred to as an electronic device 100. In this specification, an xyz Cartesian coordinate system may be used for description, according to need. In that case, the positive side in the z-axis direction may be regarded as the upper side, and the negative side in the z-axis direction may be regarded as the lower side.

<Configuration of Wiring Base 1>

The wiring bases 1 illustrated in FIGS. 1 to 10 each include an insulative base 10, a signal conductor 20, a first ground conductor 30, a first lead terminal 40, and a second lead terminal 50.

The insulative base 10 includes a first face 11 and second face 12. The insulative base 10 may have, for example, a cuboidal shape.

Figure 4:
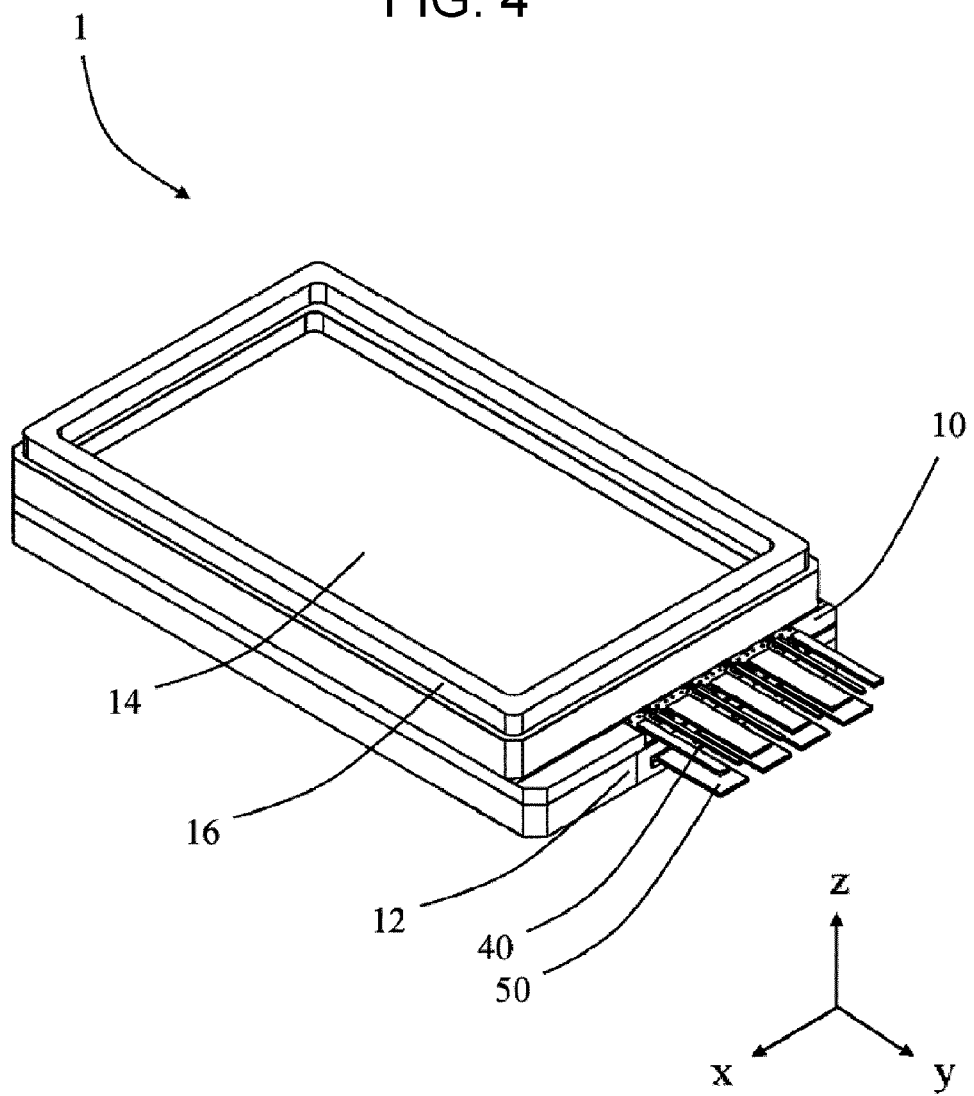
FIG. 4 is a top perspective view of a wiring base according to an embodiment of the present disclosure.
Figure 5:
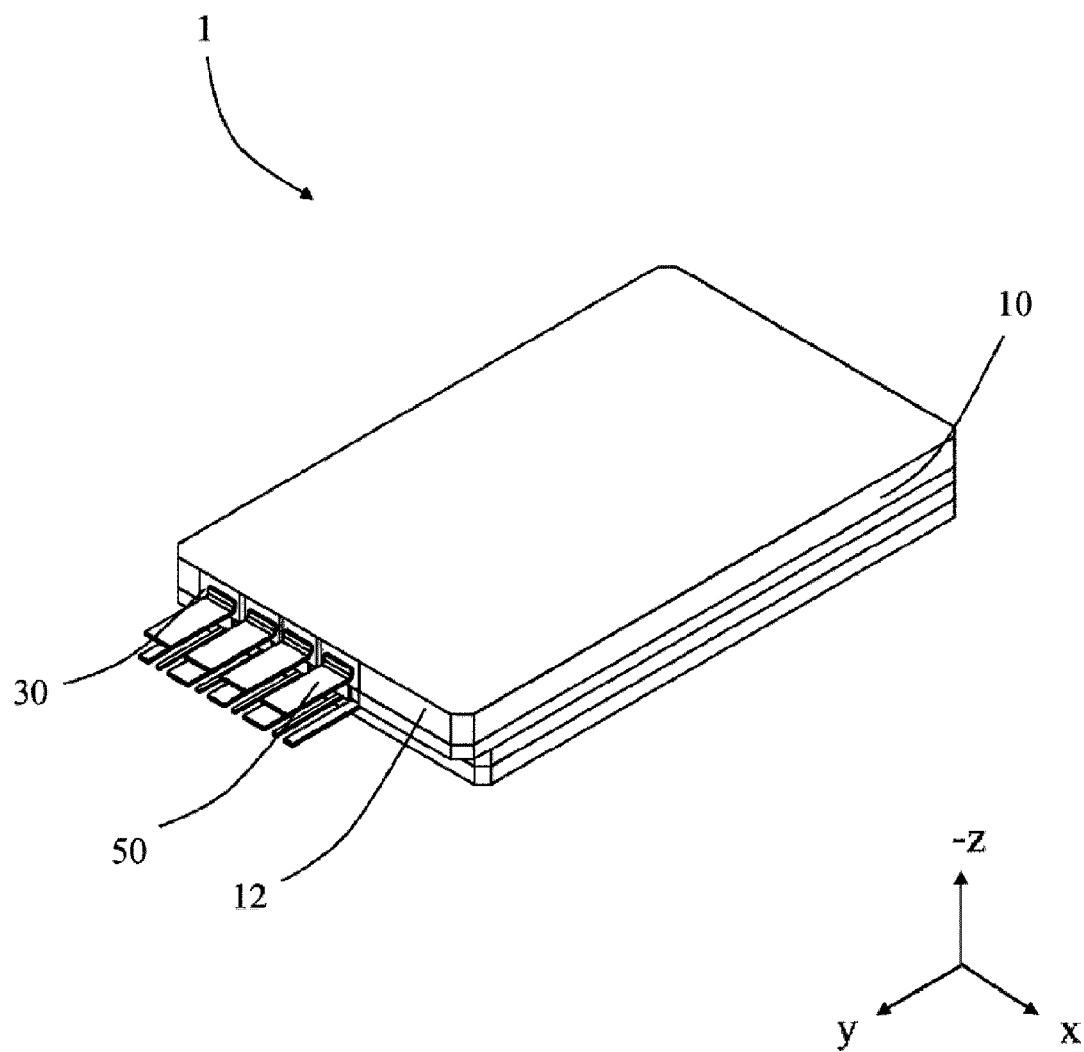
FIG. 5 is a bottom perspective view of the wiring base illustrated in FIG. 4.

FIG. 5 is a bottom perspective view of the wiring base 1 illustrated in FIG. 4. As illustrated in FIG. 5, the second face 12 may adjoin the first face 11. That is, if the insulative base 10 has a cuboidal shape with the first face 11 thereof being the top face located on the upper side of the z axis in the insulative base 10, the second face 12 may be a lateral face of the insulative base 10.

Figure 2:
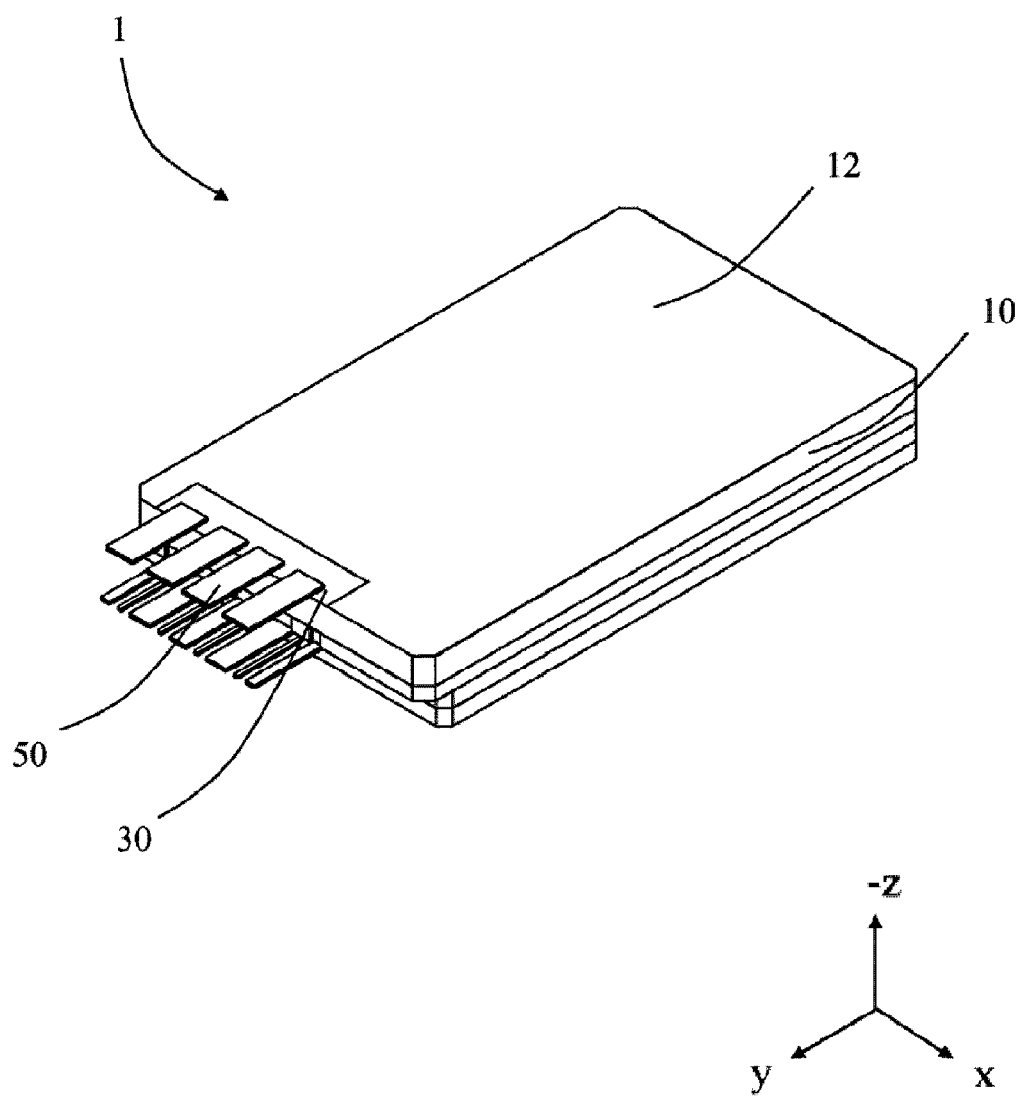
FIG. 2 is a bottom perspective view of the wiring base illustrated in FIG. 1.

FIG. 2 is a bottom perspective view of the wiring base 1 illustrated in FIG. 1. As illustrated in FIG. 2, the second face 12 may be located opposite the first face 11. That is, if the insulative base 10 has a cuboidal shape with the first face 11 thereof being the top face located on the upper side of the z axis in the insulative base 10, the second face 12 may be the bottom face located on the lower side of the z axis in the insulative base 10 than the first face 11.

The insulative base 10 may be made of, for example, a dielectric material: a ceramic material such as sintered aluminum oxide, sintered mullite, sintered silicon carbide, sintered aluminum nitride, or sintered silicon nitride; glass-ceramic; or the like.

The insulative base 10 may be a stack of dielectric layers. In this specification, the stack of dielectric layers may also be referred to as insulative layers.

The insulative base 10 in plan view toward the first face 11 may have, for example, a rectangular or U shape with a size of 5 mm by 10 mm to 50 mm by 50 mm. The insulative base 10 in plan view toward the second face 12 may have, for example, a rectangular or U shape with a size of 5 mm by 10 mm to 50 mm by 50 mm. The sizes of the insulative base 10 and the first face 11 may be determined according to need.

The signal conductor 20 is provided on the first face 11. The signal conductor 20 may extend in a first direction, which is as follows. In this specification, the first direction refers to a direction in which the first lead terminal 40 extends. The first direction coincides with the y-axis direction in the drawings.

In the present disclosure, the signal conductor 20 is a transmission line intended for transmission of high-frequency signals (10 to 100 GHz, for example). The signal conductor 20 is connected to the first lead terminal 40, which serves as a signal terminal.

The signal conductor 20 may have a length in the x-axis direction of 0.2 mm to 2 mm and a length in the y-axis direction of 0.5 mm to 5 mm. The lengths of the signal conductor 20 are not limited and may be determined according to need. The thickness of the signal conductor 20 is not limited and may be determined according to need.

The first face 11 may be provided with a second ground conductor 31, which has a ground potential. The second ground conductor 31 is connected to a third lead terminal 60, which serves as a ground terminal. The second ground conductor 31 may extend along the signal conductor 20. If the signal conductor 20 extends in the first direction, the second ground conductor 31 may also extend in the first direction.

The second ground conductor 31 may have a length in the x-axis direction of 0.5 mm to 5 mm and a length in the y-axis direction of 0.5 mm to 5 mm. The lengths of the second ground conductor 31 may be determined according to need. The thickness of the second ground conductor 31 is not limited and may be determined according to need.

Figure 3:
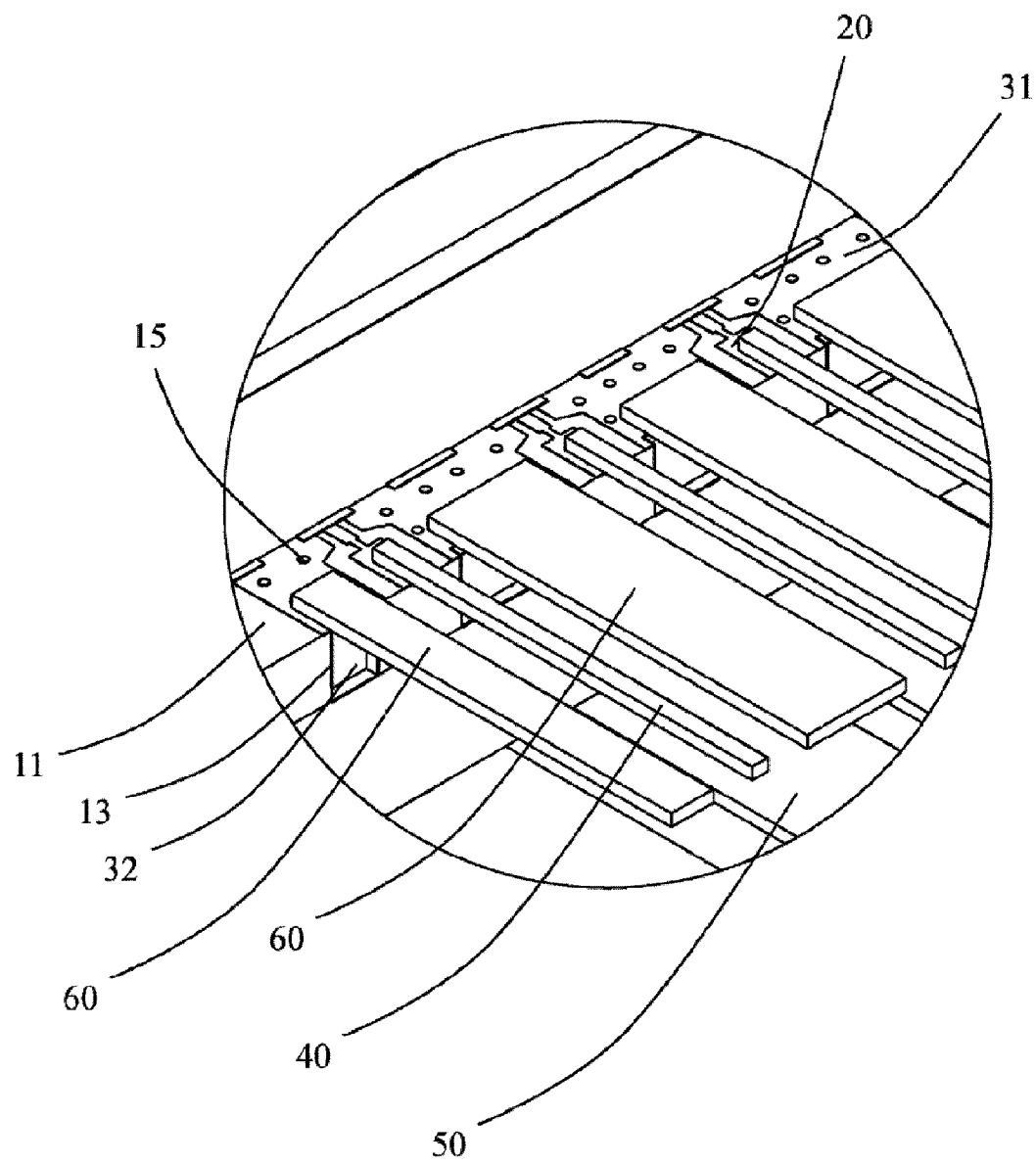
FIG. 3 is an enlargement of part III of the wiring base illustrated in FIG. 1.

The signal conductor 20 may be one of a plurality of signal conductors 20, and the second ground conductor 31 may be one of a plurality of second ground conductors 31. The plurality of signal conductors 20 and the plurality of second ground conductors 31 may be arranged alternately or in a differential-wiring pattern. The term "differential-wiring pattern" refers to a pattern in which a second ground conductor 31, a signal conductor 20, another signal conductor 20, and another second ground conductor 31 are arranged side by side in that order in the plan view toward the first face 12. A wiring base 1 including signal conductors 20 and second ground conductors 31 arranged in a differential-wiring pattern exhibits excellent immunity. FIG. 3 illustrates an exemplary alternate arrangement of a plurality of signal conductors 20 and a plurality of second ground conductors 31.

As illustrated in FIG. 3, the insulative base 10 may include a first recess 13. In the plan view toward the first face 11, the first recess 13 may be located at the outer periphery of the insulative base 10 and at an end of the second ground conductor 31. The first recess 13 may be provided with a third ground conductor 32, which has a ground potential. The third ground conductor 32 may connect the second ground conductor 31, provided on the first face 11, and the first ground conductor 30, provided on the second face 12, to each other. The first ground conductor 30 will be described separately below. Such a wiring base 1 has an increased ground area. The wiring base 1 thus having an increased ground area exhibits stable high-frequency characteristics. If the signal conductor 20 and the first lead terminal 40 are connected to each other with a bonding material, the bonding material accumulates in the first recess 13, thereby forming a fillet. Consequently, the signal conductor 20 and the first lead terminal 40 of the wiring base 1 are strongly bonded to each other.

The shape of the first recess 13 is not specifically limited. To increase the spatial volume of the first recess 13, the dielectric material defining the first recess 13 may have a tapered shape in a section orthogonal to the first direction. If the first recess 13 has an increased spatial volume, the third ground conductor 32 provided in the first recess 13 and having a ground potential has an increased area. A wiring base 1 thus having an increased ground area exhibits stable high-frequency characteristics.

The first recess 13 in the plan view toward the first face 11 may have a rectangular shape. Alternatively, the first recess 13 in the plan view toward the first face 11 may have a semicircular or semielliptical shape. A wiring base 1 including a semicircular or semielliptical first recess 13 tends to have few cracks at the end of the first recess 13.

The second face 12 is provided with the first ground conductor 30 having a ground potential. The first ground conductor 30 is connected to the second lead terminal 50, which serves as a ground terminal. The first ground conductor 30 may be one of a plurality of first ground conductors 30, the number of which may be the same as the number of signal conductors 20 as illustrated in FIG. 5. Alternatively, the first ground conductor 30 may be a single first ground conductor 30 as illustrated in FIG. 2.

The first ground conductor 30 may have a length in the x-axis direction of 0.5 mm to 20 mm and a length in the y-axis direction of 0.5 mm to 5 mm. The lengths of the first ground conductor 30 may be determined according to need. The thickness of the first ground conductor 30 is not limited and may be determined according to need.

The signal conductor 20 and the second ground conductor 31 may each be a metallized layer provided on the first face 11. The first ground conductor 30 may be a metallized layer provided on the second face 12. The third ground conductor 32 may be a metallized layer provided in a part of the insulative base 10 that defines the first recess 13. The metallized layer may contain tungsten (W), molybdenum (Mo), manganese (Mn), silver (Ag), or copper (Cu) and may be plated with nickel, gold, or the like. Alternatively, the metallized layer may contain an alloy containing at least one selected from the group consisting of the foregoing metals.

The first lead terminal 40 is located on the signal conductor 20. The first lead terminal 40 in the plan view toward the first face 11 extends in the first direction and includes a portion projecting from the insulative base 10. The first lead terminal 40 is connected to the signal conductor 20 and is intended for electrical connection to an external substrate 102 or the like. The first lead terminal 40 may be one of a plurality of first lead terminals 40. The plurality of first lead terminals 40 connected to the signal conductor 20 may be parallel. Thus, the first lead terminals 40 are electrically insulated and are allowed to be connected to the external substrate 102 or the like with reduced electromagnetic coupling.

The first lead terminal 40 may be curved in part or may be linear in a section thereof that is orthogonal to the first face 11 and contains the first direction. Using a first lead terminal 40 that is curved in part in connecting the wiring base 1 to the external substrate 102 or the like reduces the stress generated between the wiring base 1 and the external substrate 102. Therefore, a wiring base 1 that includes the partially curved first lead terminal 40 is less likely to be damaged by the stress. On the other hand, a first lead terminal 40 that is linear can be made short. Therefore, a wiring base 1 that includes the linear first lead terminal 40 can have a small size.

The first lead terminal 40 may have a length in the x-axis direction of 0.2 mm to 2 mm, a length in the y-axis direction of 2 mm to 20 mm, and a length in the z-axis direction of 0.05 mm to 0.5 mm. The lengths of the first lead terminal 40 may be determined according to need.

The first lead terminal 40 may have, for example, a rectangular or circular shape in a section orthogonal to the first direction.

Figure 12:
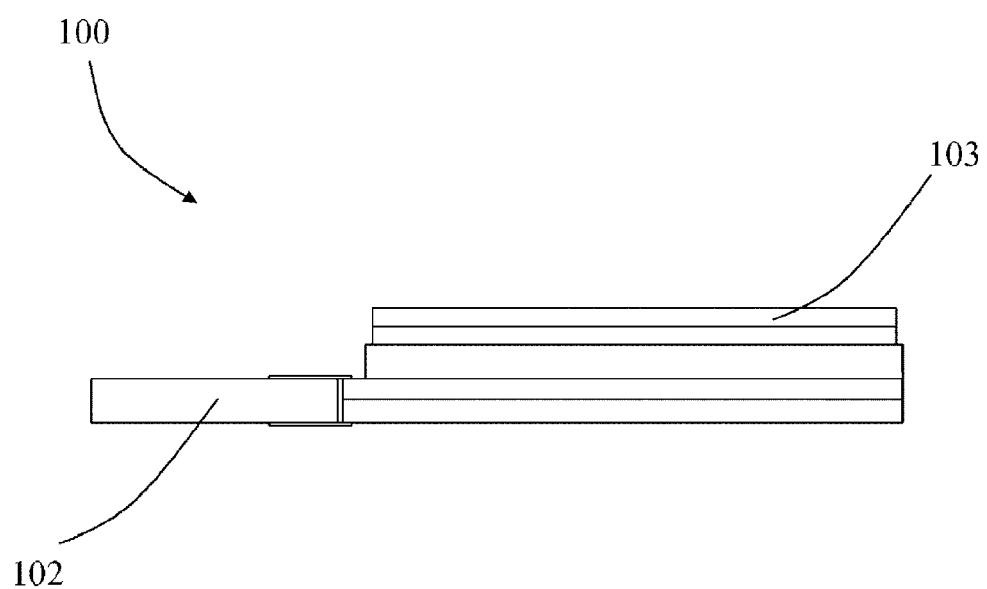
FIG. 12 is a side plan view of an electronic device according to an embodiment of the present disclosure.

The second lead terminal 50 is located on the first ground conductor 30. If the second face 12 on which the first ground conductor 30 is located is a lateral face of the wiring base 1 as illustrated in FIG. 5, the entirety of the second lead terminal 50 may be located within the insulative base 10 in the plan view toward the second face 12. If the second face 12 is the bottom face of the wiring base 1 as illustrated in FIG. 2, the second lead terminal 50 includes a portion projecting from the insulative base 10 in the plan view toward the second face 12. If a wiring base 1 having the second face 12 at the bottom thereof is connected to an external substrate 102, as illustrated in FIG. 12, the external substrate 102 may be held between the first lead terminal 40 and the second lead terminal 50.

The known optical subassembly described above tends to involve difficulty in impedance matching at the connection between the flexible substrate and the lead terminal of the optical module. Such circumstances may lead to failure in obtaining desired high-frequency characteristics. In the wiring base 1 according to the present disclosure, at least a part of the second lead terminal 50 overlaps the first lead terminal 40 in the plan view toward the first face 11. In such a configuration, impedance matching is achieved because the second lead terminal 50 serving as a ground terminal is present straightly below the first lead terminal 40 serving as a signal terminal. The wiring base 1, in which impedance matching is thus achieved, exhibits excellent high-frequency characteristics. The second lead terminal 50 is intended for electrical connection to an external substrate 102 or the like. The second lead terminal 50 may extend in the first direction. In this specification, the expression "the plan view toward the first face 11" refers to a view obtained by facing toward the first face 11 in such a manner as to see through the portion of the first lead terminal 40 that projects from the outer edge of the insulative base 10 to the portion of the second lead terminal 50 that projects from the outer edge of the insulative base 10.

The second lead terminal 50 may be a single second lead terminal 50 or one of a plurality of second lead terminals 50. The second lead terminal 50 serves as a ground terminal. That is, in the z-axis direction, a ground terminal is located on the negative side of the first lead terminal 40 intended for transmission of high-frequency signals. Therefore, the wiring base 1 exhibits stable high-frequency characteristics. In other words, since high-frequency signal transmission is achieved with no break in the ground on the negative side of the signal conductor 20 in the z-axis direction, high-frequency characteristics of the wiring base 1 are stable. If a single second lead terminal 50 is employed, the manufacturing cost or the number of person-hours is reduced. If a plurality of second lead terminals 50 is employed, the second lead terminals 50 may be provided for a plurality of respective first lead terminals 40. Furthermore, at least a part of each of the second lead terminals 50 may overlap a corresponding one of the first lead terminals 40. In such a configuration, impedance matching is achieved because the second lead terminals 50 serving as ground terminals are present straightly below the respective first lead terminals 40. The wiring base 1, in which impedance matching is thus achieved, exhibits excellent high-frequency characteristics. Furthermore, if a plurality of second lead terminals 50 is employed, an increased number of fillets are formed when the second lead terminals 50 are bonded to the first ground conductor 30. Therefore, in a wiring base 1 employing such a configuration, the second lead terminals 50 and the first ground conductor 30 are strongly bonded to each other.

In the configuration with a plurality of second lead terminals 50, the second lead terminals 50 may each have a length in the x-axis direction of 0.5 mm to 5 mm, a length in the y-axis direction of 2 mm to 20 mm, and a length in the z-axis direction of 0.05 mm to 0.5 mm. The lengths of the second lead terminal 50 may be determined according to need.

Figure 6:
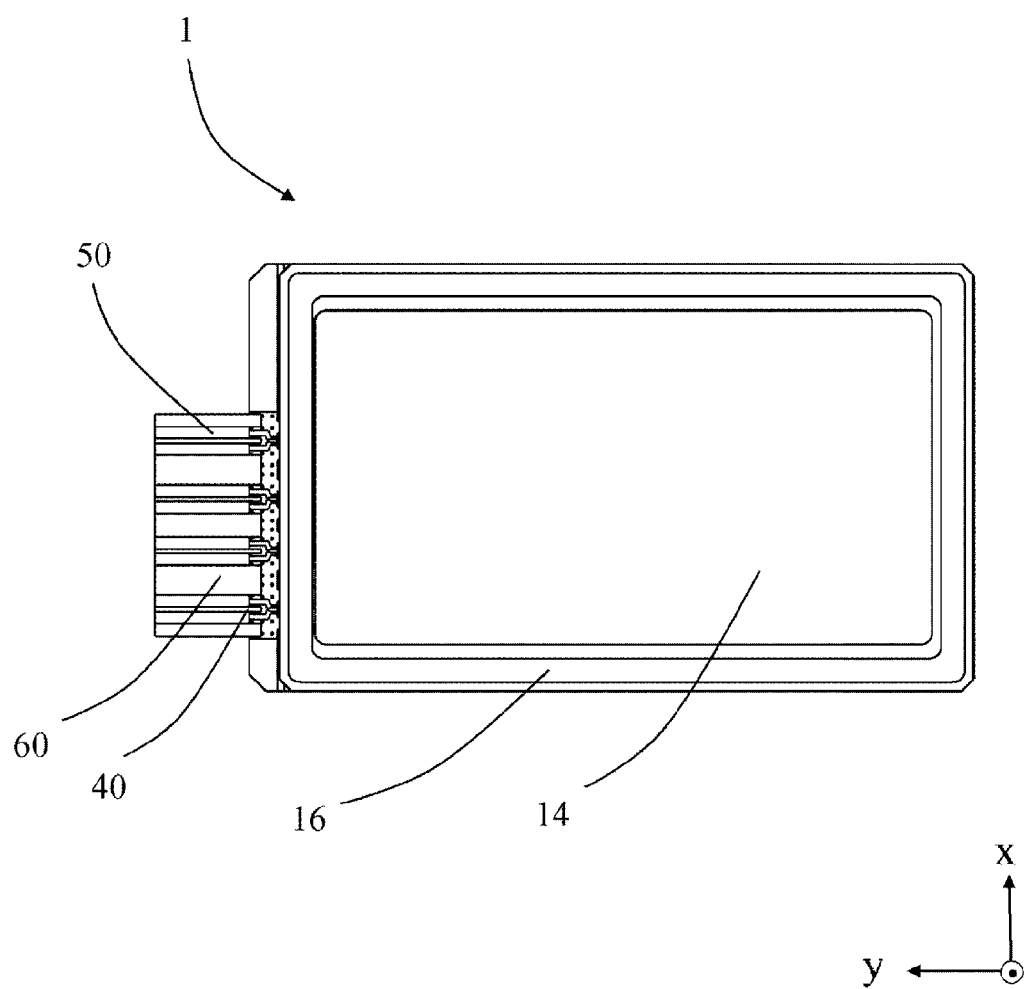
FIG. 6 is a top plan view of a wiring base according to an embodiment of the present disclosure.

As illustrated in FIG. 6, the second lead terminal 50 in the plan view toward the first face 11 may have a greater area than the first lead terminal 40. In such a configuration, the second lead terminal 50 is assuredly positioned below the first lead terminal 40 even if the first lead terminal 40 has a manufacturing error in the shape thereof or in the position thereof. Thus, stable transmission of high-frequency signals is achieved between the wiring base 1 and the external substrate 102 that are connected to each other.

In the plan view toward the first face 11, the first lead terminal 40 and the second lead terminal 50 may have an equal length in the first direction in the overlap between the two. In such a configuration, the first lead terminal 40 and the second lead terminal 50 can be cut altogether. Consequently, the number of person-hours is reduced, leading to an increase in production efficiency.

Letting a direction orthogonal to the first direction and along the first face 11 be a second direction, the first lead terminal 40 in the plan view toward the first face 11 may be located in a central part of the second lead terminal 50 in the second direction. Such a configuration realizes even electromagnetic coupling between the first lead terminal 40 and the second lead terminal 50 in the x-axis direction. Consequently, the high-frequency characteristics of the wiring base 1 are stabilized. In this specification, the term "central part" refers to any position within an area of generally allowable manufacturing errors from the exact center of the second lead terminal 50 in the second direction. The second direction coincides with the x-axis direction in the drawings.

In the first lead terminal 40 in the plan view toward the first face 11, the entirety of the portion projecting from the insulative base 10 may overlap the second lead terminal 50. In such a configuration, since the second lead terminal 50 serving as a ground surface is present below the entirety of the first lead terminal 40, high-frequency signals are stably transmitted from the wiring base 1 to the external substrate 102 connected thereto.

Figure 7:
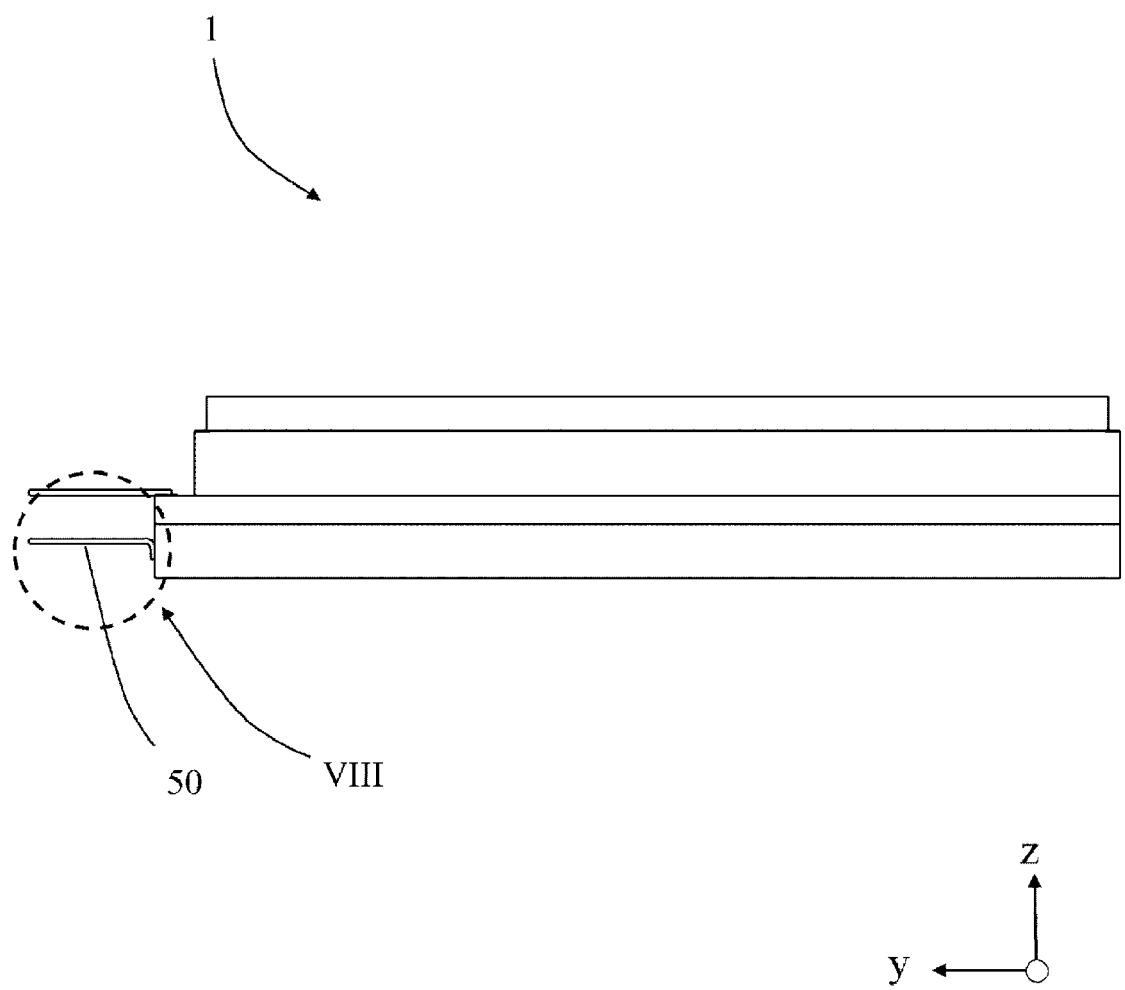
FIG. 7 is a side plan view of a wiring base according to an embodiment of the present disclosure.
Figure 8:
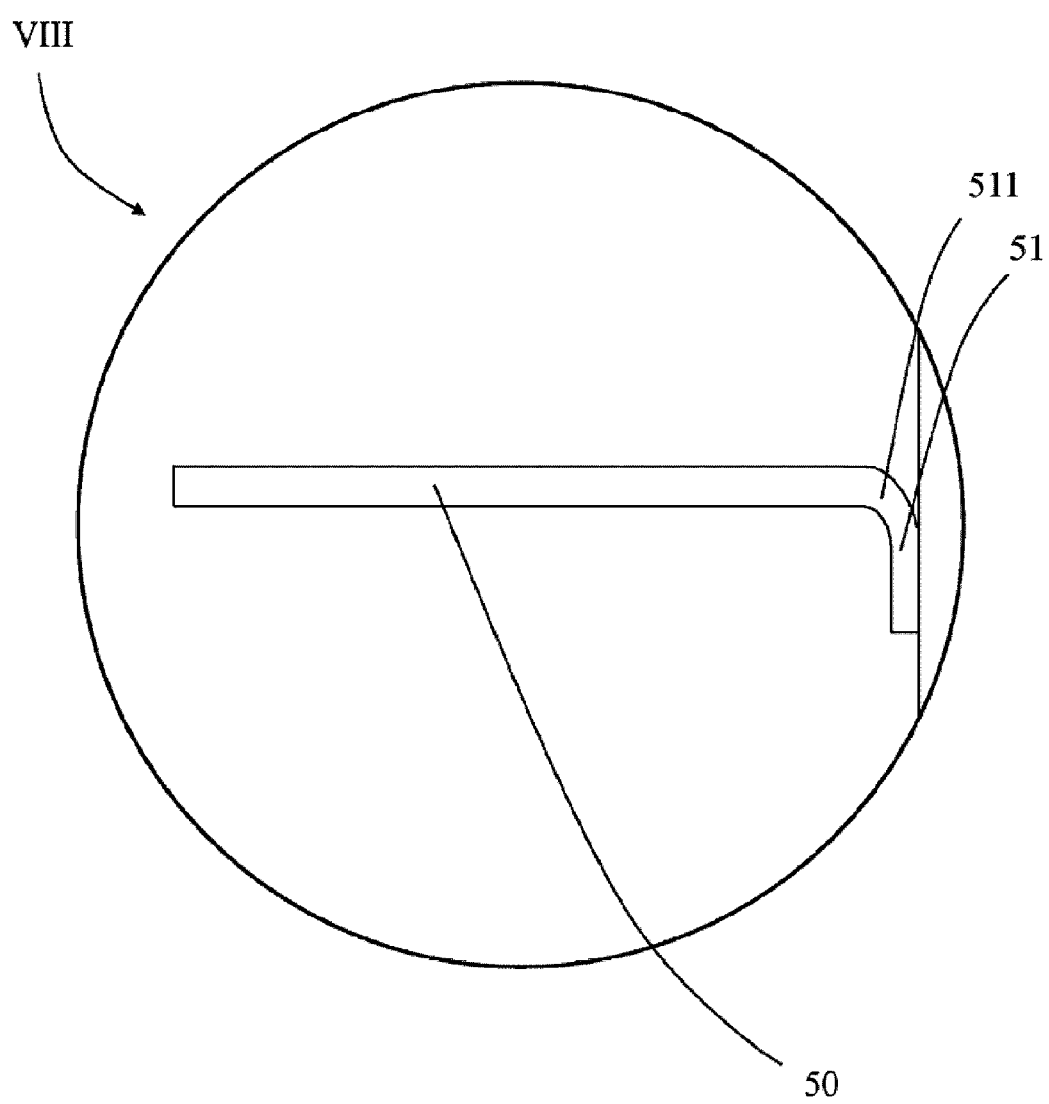
FIG. 8 is an enlargement of part VIII of the wiring base illustrated in FIG. 7.

FIG. 7 is a plan view of a wiring base 1 seen in the x-axis direction from the positive side toward the negative side. FIG. 8 is an enlargement of a relevant part of FIG. 7. As illustrated in FIG. 8, the second lead terminal 50 may include a first portion 51. The first portion 51 includes a first curved part 511. If the second face 12 is a lateral face of the wiring base 1, such a second lead terminal 50 may be connected to the first ground conductor 30 at the first portion 51. The presence of the first portion 51 increases the bonding area between the second lead terminal 50 and the first ground conductor 30 that is located on the second face 12. Therefore, the second lead terminal 50 and the first ground conductor 30 of the wiring base 1 are strongly bonded to each other. The first curved part 511 is a part of the second lead terminal 50 where the second lead terminal 50 is curved. The first portion 51 is a portion of the second lead terminal 50 that includes the first curved part 511 and that extends in a direction intersecting the first direction. When the wiring base 1 is connected to an external substrate 102, as illustrated in FIG. 13, the external substrate 102 may be held between the first lead terminal 40 and the second lead terminal 50. A wiring base 1 employing such a configuration is strongly bonded to the external substrate 102.

Figure 9:
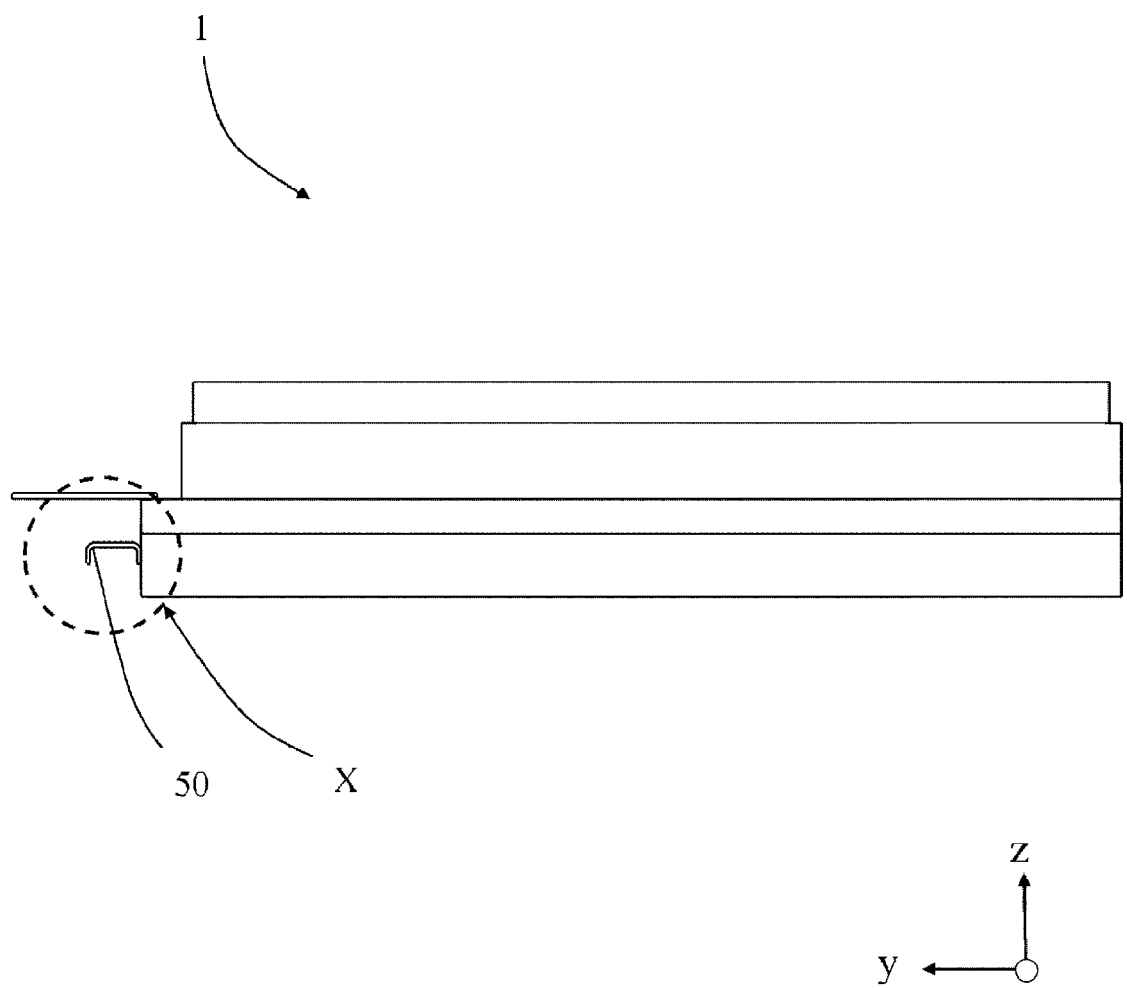
FIG. 9 is a side plan view of a wiring base according to an embodiment of the present disclosure.
Figure 10:
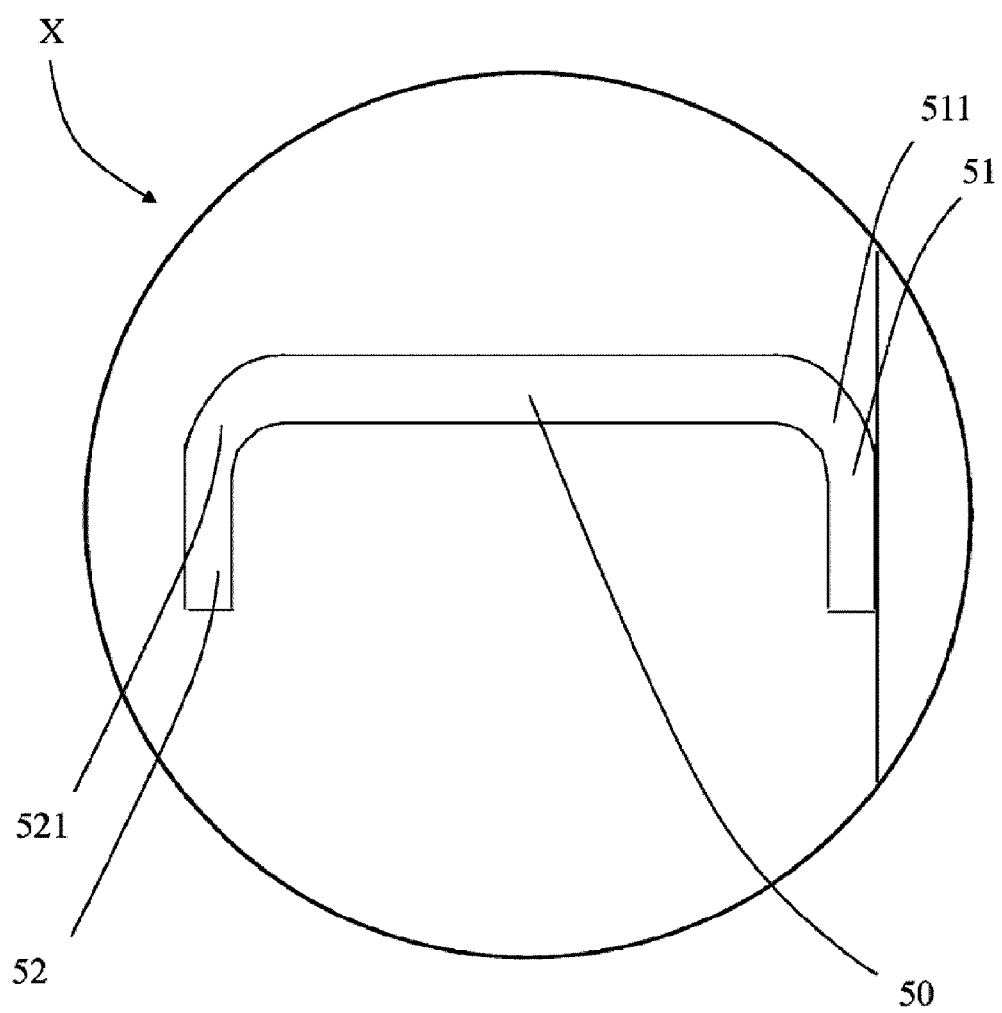
FIG. 10 is an enlargement of part X of the wiring base illustrated in FIG. 9.
Figure 11:
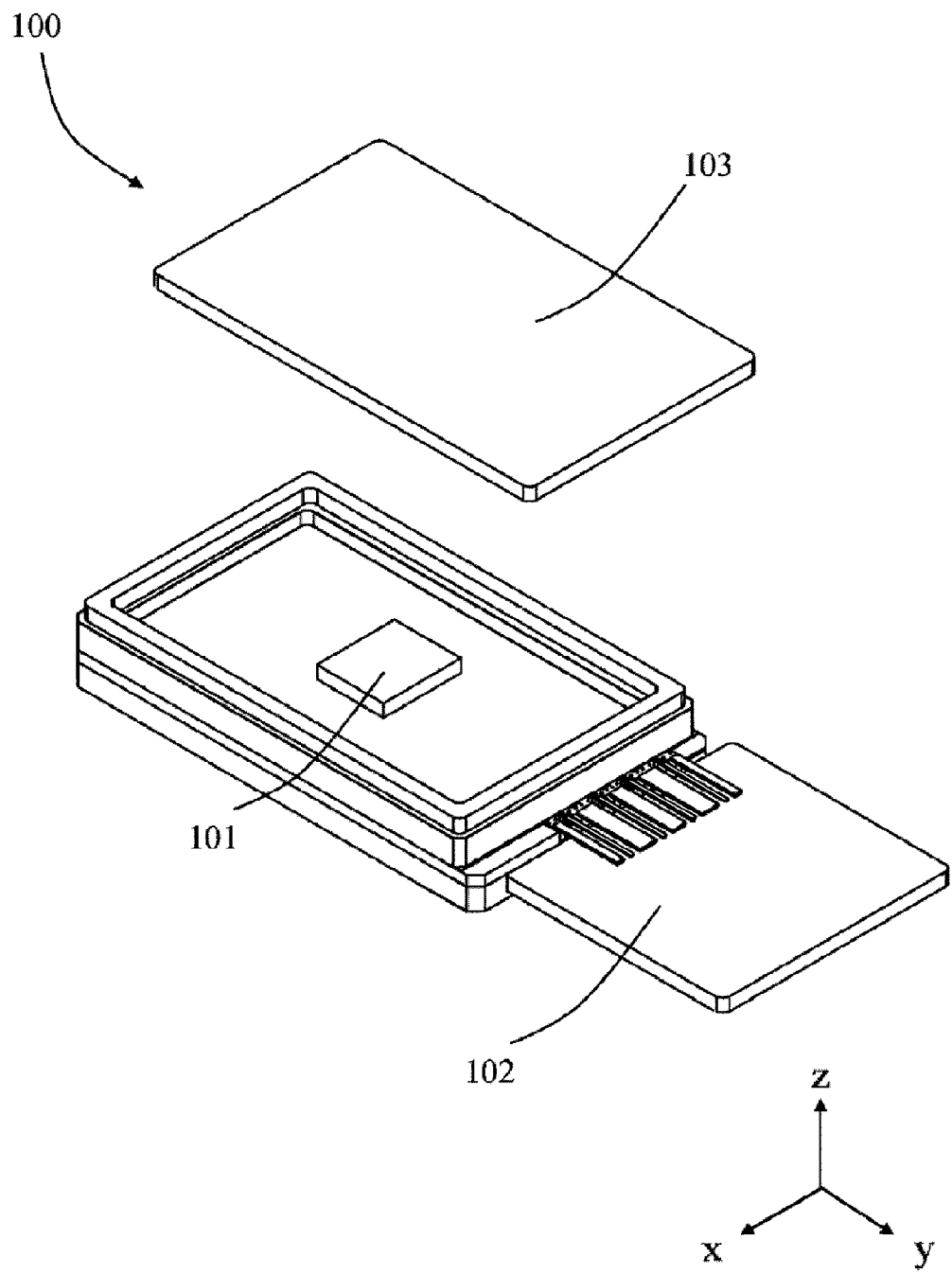
FIG. 11 is a top perspective view of an electronic device according to an embodiment of the present disclosure.

FIG. 9 is a plan view of a wiring base 1 seen in the x-axis direction from the positive side toward the negative side. FIG. 10 is an enlargement of a relevant part of FIG. 9. As illustrated in FIG. 10, the second lead terminal 50 may further include a second portion 52. The second portion 52 is located opposite the first portion 51 and includes a second curved part 521. The second portion 52 is also expressed as the end on the positive side of the y axis with reference to the first portion 51. The presence of the second portion 52 increases the bonding area between the second lead terminal 50 and the external substrate 102 that are connected to each other. Consequently, the second lead terminal 50 of the wiring base 1 and the external substrate 102 are strongly bonded to each other. The second curved part 521 is a part of the second lead terminal 50 where the second lead terminal 50 is curved and that is located opposite the first portion 51. The second portion 52 is a portion of the second lead terminal 50 that includes the second curved part 521 and that extends in a direction intersecting the first direction. The second lead terminal 50 including the second portion 52 may be connected to the external substrate 102 at the second portion 52 as illustrated in FIG. 14.

If the second lead terminal 50 extends in the first direction, a section of the second lead terminal 50 that is taken orthogonally to the first direction may have, for example, a rectangular or circular shape.

If the wiring base 1 includes the second ground conductor 31, a third lead terminal 60 may be provided on the second ground conductor 31. The third lead terminal 60 in the plan view toward the first face 11 may extend along the first lead terminal 40. Furthermore, the third lead terminal 60 may project from the insulative base 10. The third lead terminal 60 is intended for electrical connection to the external substrate 102 or the like.

The third lead terminal 60 may have a length in the x-axis direction of 0.5 mm to 5 mm, a length in the y-axis direction of 2 mm to 20 mm, and a length in the z-axis direction of 0.05 mm to 0.5 mm. The lengths of the third lead terminal 60 may be determined according to need.

The length of the third lead terminal 60 in the second direction may be greater than the length of the first lead terminal 40 in the second direction. If the third lead terminal 60 serves as a ground terminal, increasing the foregoing length of the third lead terminal 60 reduces crosstalk between the first lead terminals 40. Consequently, the wiring base 1 exhibits excellent high-frequency characteristics. The third lead terminal 60 located at each of the outer edges of the insulative base 10 in the x-axis direction may have a smaller length in the second direction than other third lead terminals 60 that are located away from the outer edges of the insulative base 10 in the x-axis direction. The third lead terminal 60 at each of the outer edges in the x-axis direction is juxtaposed with the first lead terminal 40 only on one side thereof. Therefore, the length of the foregoing third lead terminal 60 in the second direction can be reduced. Consequently, the size of the wiring base 1 can be reduced.

In a section orthogonal to the first direction, the third lead terminal 60 may have, for example, a rectangular or circular shape. In a section orthogonal to the first face 11 and containing the first direction, the third lead terminal 60 may be curved in part or may be linear. Using a third lead terminal 60 that is curved in part in connecting the wiring base 1 to the external substrate 102 or the like reduces the stress generated between the wiring base 1 and the external substrate 102. Consequently, the wiring base 1 including the third lead terminal 60 that is curved in part is less likely to be damaged by such a stress. On the other hand, a third lead terminal 60 that is linear can have a short length. Consequently, a wiring base 1 including the linear third lead terminal 60 can have a small size.

A bonding material may be used in connecting the first lead terminal 40, the second lead terminal 50, and the third lead terminal 60 to the signal conductor 20, the first ground conductor 30, and the second ground conductor 31, respectively. The bonding material may be, for example, solder or a brazing alloy.

The insulative base 10 may include an inner layer conductor provided between adjacent ones of the insulative layers. For example, in a transparent plan view toward the first face 11, the inner layer conductor provided between the insulative layers may overlap the signal conductor 20 and/or the second ground conductor 31. In this specification, the term "transparent plan view" refers to a view obtained by seeing through objects of interest in a direction toward a given plane, and is used for describing the relative position of objects that are at different depths.

An inner layer conductor intended for transmission of high-frequency signals may be connected to the signal conductor 20, located on the first face 11, through a via conductor 15. An inner layer conductor having a ground potential may be connected to the first ground conductor 30, located on the second face 12, or to the second ground conductor 31, located on the first face 11, through a via conductor 15. Alternatively, an inner layer conductor having a ground potential may be directly connected to the third ground conductor 32, located in the first recess 13.

If an inner layer conductor provided between the insulative layers is connected to the signal conductor 20 through a via conductor 15 while another inner layer conductor is connected to the first ground conductor 30 or the second ground conductor 31 through a via conductor 15, the two inner layer conductors need to be arranged in such a manner as not to be short-circuited. Any inner layer conductors of the same potential may be connected to one another through via conductors 15.

The insulative base 10 may include the first face 11 and a mounting part 14, where an electronic component 101 is to be mounted. In other words, the mounting part 14 may be integrated with the insulative base 10. If the insulative base 10 includes the mounting part 14, the mounting part 14 may be located at the first face 11 or at the face opposite the first face 11. The mounting part 14 may be provided on another substrate that is separate from the insulative base 10.

The substrate may have, for example, a rectangular plan-view shape and may have a plan-view size of 5 mm by 10 mm to 50 mm by 50 mm.

The substrate may contain, for example, metal such as iron (Fe), copper (Cu), nickel (Ni), chromium (Cr), cobalt (Co), molybdenum (Mo), or tungsten (W); or an alloy of any of the foregoing metals. A substrate containing the foregoing metal material is manufacturable by subjecting an ingot of the metal material to a metal processing such as rolling or punching. Alternatively, the substrate may contain a dielectric material. The dielectric material may be, for example, a ceramic material such as sintered aluminum oxide, sintered mullite, sintered silicon carbide, sintered aluminum nitride, or sintered silicon nitride; or glass-ceramic. A substrate containing the foregoing dielectric material may be plated with nickel or gold. A substrate plated with nickel or gold exhibits excellent wettability for bonding materials, corrosion resistance, and weather resistance.

The insulative base 10 may include a frame 16, which surrounds the mounting part 14. The frame 16 may be integrated with the insulative base 10. Alternatively, the frame 16 may be separate from the insulative base 10. In the wiring base 1 illustrated in FIG. 1 or 4, the mounting part 14 and the insulative base 10 are integrated with each other, whereas the frame 16 and the insulative base 10 are separate from each other.

The frame 16 may have a rectangular plan-view shape. The frame 16 may have a size of, for example, 5 mm by 10 mm to 50 mm by 50 mm with a height of 2 mm to 15 mm. The frame 16 may have a thickness of 0.5 mm to 2 mm.

The frame 16 may contain, for example, metal such as iron (Fe), copper (Cu), nickel (Ni), chromium (Cr), cobalt (Co), molybdenum (Mo), or tungsten (W); or an alloy of any of the foregoing metals. A frame 16 containing the foregoing metal material is manufacturable by subjecting an ingot of the metal material to a metal processing such as rolling or punching. Alternatively, the frame 16 may contain a dielectric material. The dielectric material may be, for example, a ceramic material such as sintered aluminum oxide, sintered mullite, sintered silicon carbide, sintered aluminum nitride, or sintered silicon nitride; or glass-ceramic. A frame 16 containing the foregoing dielectric material may be plated with nickel or gold. A frame 16 plated with nickel or gold exhibits excellent wettability for bonding materials, corrosion resistance, and weather resistance.

If the frame 16 and the insulative base 10 are separate from each other, the frame 16 may include a fitting part, which is provided at a sidewall of the frame 16 and to which the wiring base 1 is fitted. The fitting part may extend through the frame 16 in a direction along the mounting plane of the mounting part 14 on which an electronic component 101 is to be mounted.

<Configuration of Electronic Device 100>

Electronic devices 100 illustrated in FIGS. 11 to 14 each include the above-described wiring base 1, an electronic component 101, and an external substrate 102. In the electronic device 100 including the wiring base 1, the transmission loss for high-frequency signals is small.

The electronic component 101 may be, for example, an optical semiconductor such as an LD (laser diode) or a PD (photodiode). Alternatively, the electronic component 101 may be a light-emitting device such as an LED (light-emitting diode), an integrated circuit such as an LSI (large-scale integration), or the like.

In the electronic device 100, the electronic component 101 is mounted on the mounting part 14. The electronic component 101 is electrically connected to the wiring base 1 through, for example, a bonding wire or a flip chip.

The external substrate 102 may be, for example, an FPC (flexible printed circuits) or a thin-film substrate. The external substrate 102 may be connected to the first lead terminal 40, the second lead terminal 50, or the third lead terminal 60 with a brazing alloy or the like.

The electronic device 100 may include a lid 103. The lid 103 may be located above the frame 16 and cover the electronic component 101. If the lid 103 covers the electronic component 101, the lid 103 may seal the electronic device 100. If the frame 16 is separate from the insulative base 10, the lid 103 may be integrated with the frame 16. If the lid 103 is integrated with the frame 16, the frame 16 may be made of the same material as the insulative base 10. If the lid 103 is separate from the frame 16, the lid 103 and the frame 16 may be bonded to each other with a bonding material. The bonding material may be, for example, thermosetting resin, or a brazing alloy containing low-melting glass or metal.

The lid 103 may have a rectangular shape in the plan view toward the first face 11. Such a rectangular lid 103 may have a size of 5 mm by 10 mm to 50 mm by 50 mm with a thickness of 0.5 mm to 2 mm. The lid 103 may contain, for example, metal such as iron (Fe), copper (Cu), nickel (Ni), chromium (Cr), cobalt (Co), molybdenum (Mo), or tungsten (W); or an alloy of any of the foregoing metals. A metal member serving as the lid 103 is manufacturable by subjecting an ingot of the foregoing metal material to a metal processing such as rolling or punching.

<Method of Manufacturing Wiring Base 1 and Electronic Device 100>

An exemplary method of manufacturing the wiring base 1 and the electronic device 100 according to any of the embodiments of the present disclosure will now be described. The following exemplary manufacturing method is a method of obtaining insulative bases 10 from a multiple-production base.

(1) A ceramic green sheet that is to serve as insulative bases 10 is formed. Insulative bases 10 basically made of sintered aluminum oxide ($Al_2O_3$) are obtained as follows, for example. Powder of $Al_2O_3$ is mixed with powder of a sintering aid such as silica ($SiO_2$), magnesia (MgO), or calcia (CaO). Furthermore, a suitable set of a binder, a solvent, and a plasticizer is added to the powder of $Al_2O_3$. The mixture of the foregoing materials is stirred into slurry. The mixture in the form of slurry is subjected to a forming technique using a doctor blade, a calendar roll, or the like, whereby a ceramic green sheet for a multiple-production base is obtained. In this step, cutouts that are to serve as first recesses 13 may be provided at predetermined positions of the ceramic green sheet. The cutouts that are to serve as first recesses 13 at predetermined positions of the ceramic green sheet may be provided by using a die, a punch, a laser, or the like.

(2) The ceramic green sheet obtained in the above step (1) is subjected to screen printing or the like, in which metal paste is applied to or injected into each of regions of the ceramic green sheet where signal conductors 20, first ground conductors 30, second ground conductors 31, third ground conductors 32, inner layer conductors, and via conductors 15 are to be formed. The metal paste is obtained by mixing metal powder containing the above-listed metals with a suitable set of solvent and a binder and stirring the mixture such that the mixture has a suitable viscosity. The metal paste may contain glass or ceramic for increasing the strength of bonding to the insulative base 10.

(3) The ceramic green sheet obtained at the completion of the step (2) is processed by using a die or the like.

(4) Pieces of ceramic green sheet obtained in the step (3) are stacked and are compressed, whereby a compact of ceramic green sheets is obtained.

(5) The compact of ceramic green sheets is fired at a temperature of about 1500° C. to 1800° C., whereby a multiple-production base in which a plurality of insulative bases 10 are stacked is obtained. If cutouts that are to serve as first recesses 13 are provided in the step (1), the first recesses 13 are obtained at the completion of the firing. In the step (5), the metal paste described above is fired together with the ceramic green sheets that are to serve as insulative bases 10, whereby the metal paste turn into each of signal conductors 20, first ground conductors 30, second ground conductors 31, third ground conductors 32, inner layer conductors, via conductors 15, and so forth. Wiring bases 1 thus obtained in the above manufacturing method each include an insulative base 10, and the insulative base 10 includes a signal conductor 20, a first ground conductor 30, a second ground conductor 31, a third ground conductor 32, an inner layer conductor, and a via conductor 15.

(6) The wiring bases 1 obtained in the step (5) are subjected to a surface-finishing process such as plating.

(7) The multiple-production base including the plurality of wiring bases 1 is divided into individual pieces. In dividing the multiple-production base, cutting grooves may be provided in the multiple-production base along the outlines of the wiring bases 1, and the multiple-production base may be broken along the cutting grooves. Alternatively, the multiple-production base may be cut by using a slicing device or the like along the outlines of the wiring bases 1. The cutting grooves may be provided by making cuts with a slicing device after the firing step to a depth smaller than the thickness of the multiple-production base. Alternatively, the cutting grooves may be provided by pressing the blade of a cutter into the compact of ceramic green sheets for a multiple-production base, or may be provided by making cuts in the compact of ceramic green sheets with a slicing device to a depth smaller than the thickness of the compact of ceramic green sheets. Prior to the dividing step, the wiring bases 1 in the form of the above multiple-production base may be electrolytically plated. Alternatively, the wiring bases 1 obtained by dividing the above multiple-production base may be electrolytically plated.

(8) Electronic components 101 are mounted on the wiring bases 1, whereby electronic devices 100 are obtained. The electronic components 101 may be electrically bonded to the wiring bases 1 with a bonding material such as bonding wires. Alternatively, adhesive or the like may be applied to the electronic components 101 or to the wiring bases 1, whereby the electronic components 101 may be fixed to the wiring bases 1. After the electronic components 101 are mounted on the wiring bases 1, lids 103 may be bonded to the respective wiring bases 1 with a bonding material.

The present disclosure is not limited to the above embodiments. The above configurations may be varied by changing relevant values or any other factors. The way of combining features employed in the above embodiments of the present disclosure is not limited to those described above.

INDUSTRIAL APPLICABILITY

The present disclosure is applicable to wiring bases and electronic devices.

REFERENCE SIGNS 1 wiring base
10 insulative base
11 first face
12 second face
13 first recess
14 mounting part
15 via conductor
16 frame
20 signal conductor
30 first ground conductor
31 second ground conductor
32 third ground conductor
40 first lead terminal
50 second lead terminal
51 first portion
511 first curved part
52 second portion
521 second curved part
60 third lead terminal
100 electronic device
101 electronic component
102 external substrate
103 lid

The invention claimed is:

1. A wiring base comprising:
an insulative base including a first face and a second face;
a signal conductor provided on the first face;
a first lead terminal provided on the signal conductor, the first lead terminal extending in a first direction and including a portion projecting from the insulative base in plan view as viewed in a direction toward the first face;
a first ground conductor provided on the second face;
a second lead terminal provided on the first ground conductor, wherein at least a part of the second lead terminal overlaps the first lead terminal in the plan view;
a second ground conductor provided on the first face;
a third lead terminal connected to the second ground conductor and extending along the signal conductor in the plan view;
a first recess provided at an outer periphery of the insulative base and at an end of the second ground conductor in the plan view; and
a third ground conductor provided in the first recess, wherein the first ground conductor and the second ground conductor are connected to each other through the third ground conductor.

2. The wiring base according to claim 1,
wherein the second lead terminal has a greater area than the first lead terminal in the plan view.

3. The wiring base according to claim 1,
wherein the first lead terminal and the second lead terminal in the plan view have an equal length in the first direction in an overlap between the first lead terminal and the second lead terminal.

4. The wiring base according to claim 1,
wherein a direction orthogonal to the first direction and along the first face is defined as a second direction, and
wherein the first lead terminal in the plan view is located in a central part in the second direction.

5. The wiring base according to claim 1,
wherein the second face adjoins the first face, and
wherein the second lead terminal includes a first portion including a first curved part and is connected to the first ground conductor at the first portion.

6. The wiring base according to claim 5,
wherein the second lead terminal includes a second portion including a second curved part, the second portion being located opposite the first portion.

7. The wiring base according to claim 1,
wherein the second face is located opposite the first face.

8. The wiring base according to claim 1,
wherein the first lead terminal is one of a plurality of first lead terminals, and the second lead terminal is one of a plurality of second lead terminals provided for the plurality of respective first lead terminals, and
wherein at least a part of each of the second lead terminals overlaps a corresponding one of the first lead terminals.

9. The wiring base according to claim 1,
wherein, in the first lead terminal in the plan view, an entirety of the portion projecting from the insulative base overlaps the second lead terminal.

10. An electronic device, comprising:
the wiring base according to claim 1; and an external substrate connected to the first lead terminal and to the second lead terminal.

11. The electronic device according to claim 10, wherein the external substrate is held between the first lead terminal and the second lead terminal.

12. An electronic device, comprising:
the wiring base according to claim 6; and
an external substrate connected to the first lead terminal and to the second lead terminal,
wherein the second lead terminal is connected to the external substrate at the second portion.

\* \* \* \* \*